United States Patent
Reimer et al.

(10) Patent No.: US 6,556,149 B1
(45) Date of Patent: Apr. 29, 2003

(54) SWITCHES AND JOYSTICKS USING A NON-ELECTRICAL DEFORMABLE PRESSURE SENSOR

(75) Inventors: Ernest M. Reimer, Oster Cove (CA); Robert Inkster, Victoria (CA)

(73) Assignee: Canpolar East Inc., Newfoundland (CA)

(*) Notice: Subject to any disclaimer, the term of this patent is extended or adjusted under 35 U.S.C. 154(b) by 0 days.

(21) Appl. No.: 09/511,383

(22) Filed: Feb. 23, 2000

(30) Foreign Application Priority Data

Mar. 1, 1999 (CA) .............................. 2263744

(51) Int. Cl.⁷ .............................................. H03K 17/94
(52) U.S. Cl. ........................ 341/20; 345/175; 345/176; 250/227.21; 250/227.22; 74/471 XY
(58) Field of Search ................ 341/20, 22, 31, 341/34; 250/227.21, 227.22; 74/471 XY; 345/175, 176, 170

(56) References Cited

U.S. PATENT DOCUMENTS

| | | | |
|---|---|---|---|
| 3,857,304 A | 12/1974 | Berndt | 74/513 |
| 3,877,299 A | 4/1975 | Clayton, Sr. et al. | 73/132 |
| 3,931,764 A | 1/1976 | Malisch et al. | 102/106 |
| 4,036,078 A | 7/1977 | Muehling | 74/529 |
| 4,087,776 A | 5/1978 | Donato | 338/198 |
| 4,228,878 A | 10/1980 | Kisami | 477/4 |
| 4,297,550 A | 10/1981 | Leighton | 200/61.89 |
| 4,505,151 A | 3/1985 | Sauerschell et al. | 73/116 |
| 4,698,466 A | 10/1987 | Beck et al. | 200/61.78 |
| 4,809,180 A | 2/1989 | Saitoh | 701/49 |
| 4,887,840 A | 12/1989 | Harara et al. | 280/5.503 |
| 4,888,535 A | 12/1989 | Brusasco | 318/568.1 |
| 5,198,629 A | 3/1993 | Hayashi et al. | 200/61.54 |
| 5,217,247 A | 6/1993 | Nezu et al. | 380/5.501 |
| 5,330,025 A | 7/1994 | Kamei | 180/170 |
| 5,588,673 A | 12/1996 | Green et al. | 280/731 |
| 5,666,860 A | 9/1997 | Baumann et al. | 74/513 |
| 5,701,245 A | 12/1997 | Ogawa et al. | 701/37 |
| 5,743,386 A | 4/1998 | Liao | 200/512 |
| 5,756,950 A | 5/1998 | De Fillippo | 200/61.54 |
| 5,917,180 A * | 6/1999 | Reimer et al. | 250/227.14 |
| 6,263,733 B1 * | 7/2001 | Reimer et al. | 73/514.26 |

FOREIGN PATENT DOCUMENTS

WO    WO99/04234    1/1999

* cited by examiner

Primary Examiner—Michael Horabik
Assistant Examiner—Albert K. Wong
(74) Attorney, Agent, or Firm—McFadden, Fincham

(57) ABSTRACT

Switches and joysticks comprise user-moveable two position and multi position switches, including simple on/off and variable switches such as dimmers. The switches operate on the principle of detecting the position of a user-grippable switch arm, a portion of which bears on a pressure-sensitive pad. The pad is a deformable material which detects and localizes pressure against the pad, by transmitting into the pad matrix a wave energy such as light, and detecting the intensity of same. As the pad is locally compressed, intensity of the wave energy increases in the region around the compression. The position of a switch arm may thus be detected, and the information transmitted to a central processing unit, for further processing.

25 Claims, 7 Drawing Sheets

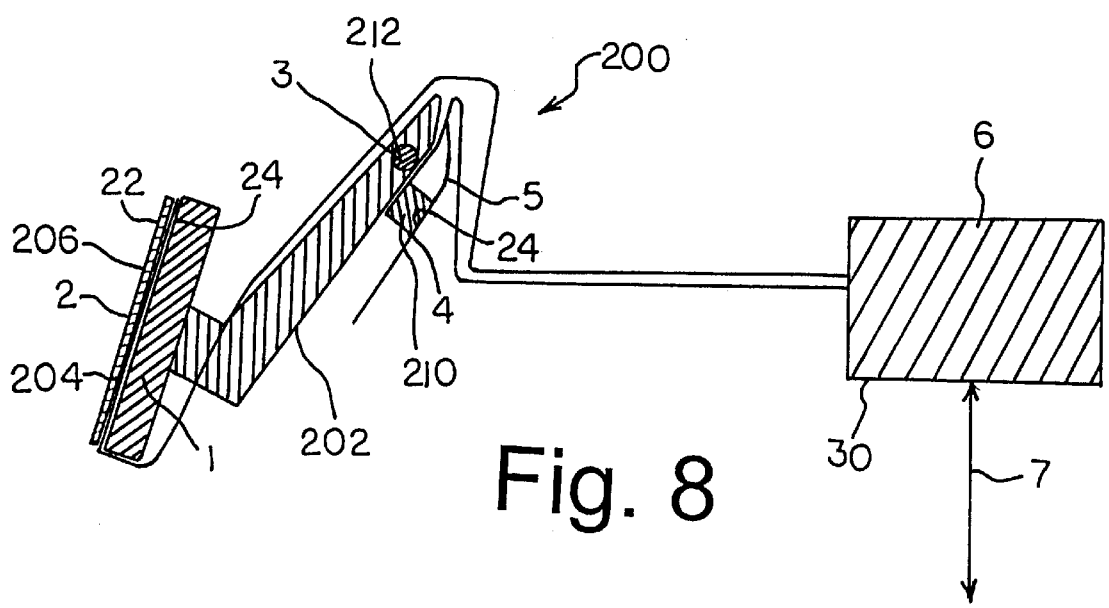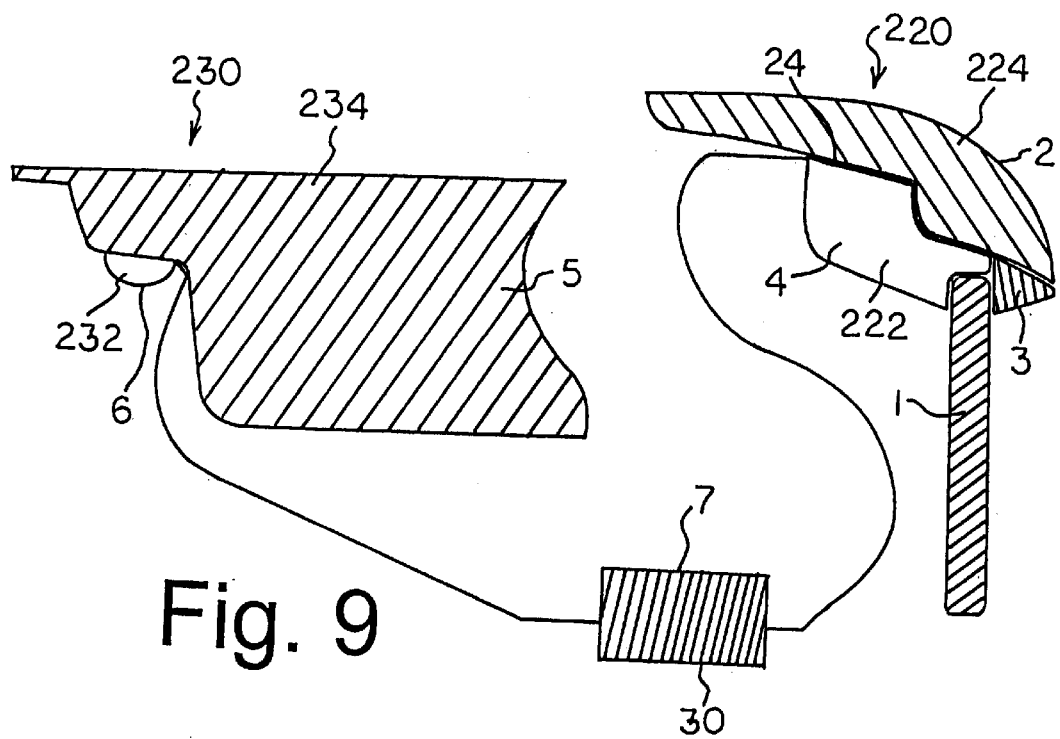

SWITCHES AND JOYSTICKS USING A NON-ELECTRICAL DEFORMABLE PRESSURE SENSOR

FIELD OF THE INVENTION

The present invention relates to switches and control devices such as joy sticks, on/off switches and variable control switches. The invention further relates to control panels incorporating multiple switching devices. The invention further relates to switches, joysticks and the like wherein the user actuated movement of the device is detected by a pressure sensor, without the use of electrical contacts within the switching or control device and the corresponding information is relayed electronically to a central processing unit.

BACKGROUND OF THE PRIOR ART

The field of user actuated control means includes switches, joysticks and the like. Examples include 2-position on-off switches, multi position variable control switches (such as light dimmers), push button switches, multi position joysticks, and others. Such devices are characterized by a moveable member, which typically comprises a lever arm or push button actuated by a user, and a detector for detecting movement of the member. Within conventional on/off switches, a lever arm or toggle is associated with electrical contacts, wherein within a first position electrical contact is made, and when actuated by a user to a second position, electrical contact is broken. In an alternative arrangement, such as is found in joysticks and other like multi-position control means, a lever arm or the like is associated with a sensor for detecting the particular position of the arm. The arm may be mounted for sliding contact along a linear path (e.g. a light dimmer) or for movement on a 2 dimensional plane (e.g. a joystick). Conventionally such arrangements are similarly exemplified by various electrical contacts.

There is a need for switching and control units that incorporate a minimum of moving parts, are relatively inexpensive to fabricate and which do not rely on electrical contact in order to achieve a switching function. This results in less expensive and more reliable arrangement. In particular, such a need is experienced within the automotive industry, which uses a relatively large number of user-actuated switches and control means.

For example, within an automobile, switches and controls are generally found within the seat, door, steering wheel and front panel, for controlling a multitude of function and vehicle operations. Typically, pushing a switch sends an electrical detection signal via a supply wire to an actuator unit, possibly within a micro controller to perform the initiated function (see U.S. Pat. No. 4,809,180). These automotive switches are used to activate or deactivate circuits to perform certain functions (see U.S. Pat. No. 4,888, 535).

The switches discussed above can be used in a variety of locations within a vehicle. Manipulator switches may be found on the side arm of a seat for altering its position and height. These switches are used to adjust certain features of the automobile according to the occupant's preferences. Similar switch panels may be found on the door armrest to activate power window and power mirror functions. Similar switch arrays may be found on the driver control console for activating many of the primary driving facilities in the car. A detection switch may also be used to detect current status of an automobile component, such as the open/closed status of a vehicle door. Related to this detection switch is the courtesy switch used to turn on a vehicle light when the car door is opened or trunk lid lifted or glove compartment opened. These switches include an actuating plunger which moves under spring pressure when spacings between a moveable and fixed lever increase. This type of lever or plunger is quite common in many switches (see U.S. Pat. No. 4,698,466).

Many occupant control switches are typically membrane switches. Membrane switches usually consists of a pair of parallel contact plates, possibly flexible electrodes, separated in the inoperative position due to the presence of a resilient element positioned between the two layers This resilient element could be a dielectric layer with a specific pattern defining opposing electrodes or an elastically yielding body filled between the plates. When a switch is touched or contacted, the two metal plates or electrodes make electrical contact, activating the proper response. Many membrane switches include an operating press member, acting on one metal plate, displacing the member into operative position (see U.S. Pat. Nos. 5,588,673, 5,743,386, 5,756,950 & 5,198,629).

Occupant controls such as a steering wheel, brake pedal and accelerator pedal may be fitted with simple switches to detect activation or with position sensing devices to detect the degree of actuation. Many brake pedals are comprised of a support bracket mounted to the firewall, brake pedal lever hinged thereto, resilient element urging brake pedal rearwardly and a switch located on either the support or lever. When these two members contact, due to the forward movement of the lever, the switch is activated, which connects the lever member to the brake system push rod (see U.S. Pat. No. 4,297,550). A number of such occupant control technologies have been cited in patent literature.

In addition to installing switches to ensure occupant comfort and pleasure, automobiles also include a suspension control apparatus that is used to provide a comfortable and stable ride. This apparatus counters change in the attitude of a vehicle, which may occur during braking, accelerating, turning and so on.

A suspension control apparatus generally consist of a fluid spring chamber, which is located between each road wheel and body of the vehicle, in addition to multitude of sensors. Sensors commonly implemented include vehicle height, speed, steering angle and acceleration sensors. Based on signals from these various sensors, the suspension control device regulates the amount of hydraulic fluid to be supplied to or discharged from the suspension systems (see U.S. Pat. Nos. 5,217,247; 4,887,840; 5,701,245; and 5,330,025).

User-actuated controls may be placed into two general categories. Within a first, a switch describes an on/off motion. Within a second, a range of positions is detected. For example, a conventional light dimmer or joystick would fall into the second category.

It is desirable within all such applications to provide a simple, accurate and reliable means for detection of position of a control arm.

It is proposed to provide a switch or control means that relies on a pressure sensor of the type described within PCT publication no. WO 99/04234. This type of pressure senor relies on a deformable integrating cavity for detecting a pressure applied to the cavity. Typically, the arrangement is comprised of a material such as translucent foam, which receives wave energy such as light from a source. A detector detects intensity of the light or other energy within the material. The sensor operates on the principle whereby the deformation of the material increases the light intensity in the region around the source. Thus, in the case where the source and detector are adjacent to each other or in the vicinity of each other, an increase in pressure on the material and consequent deformation in the region of the light source results in a consequent increase in the intensity of light detected by the detector. The resulting signal may be transmitted to a processing unit, which in turn quantifies the pressure experienced by the material. In one version, the light source and detector each comprise single or multiple fiber optic strands leading to and from the sensor. Within this arrangement, multiple sensors and detectors may be poisoned at different positions around the sensor mass, thereby detecting the location of pressure applied to the material. For example, a sheet of deformable material may be underlain with a planar array of light emitter/detector pairs, which detect and localize deformation of a particular portion of the sheet.

This principle is particularly advantageous for use with switches and the like, since the position of a user-moveable arm may be detected by a pressure sensor of the type described above.

SUMMARY OF THE INVENTION

The invention comprises in one aspect, a user-activated switching or control means, comprising a moveable arm having first and second ends, the first end being moveable by a user; a mount for moveable mounting of the arm; a deformable or compressible material in contact with the second end of the arm, the deformable material comprising an integrated cavity for scattering or defusing wave energy such as light; a wave energy source and detector in communication with the deformable material; and processing means to receive signals from the detector and convert the signals into useable information relating to the position of the arm relative to the deformable material.

The arm and the integrating cavity are arranged such that movement of the arm in a selected direction locally compresses the deformable material, thereby transmitting corresponding information respecting the arm position to the processing unit.

Conveniently, the deformable material may comprise a deformable, light translucent material such as foam, and the wave energy source and receiver respectively comprise fiber optic cables, associated with a light source and detector, respectively.

In a further aspect, multiple light sources and receivers are provided at different positions around the deformable material, thereby detecting multiple positions of the arm.

In a further aspect, the invention comprises a lever arm switch, wherein the arm is pivotally mounted to a pivot, and the second end of the arm comprises a base region in engagement with an elongate integrating cavity such as a foam block. In this arrangement, movement of the arm in one direction or the other about the pivot achieves a corresponding movement of the base, which compresses a corresponding. Conveniently, a light source and detector pair are positioned at the respective ends of the deformable material, thereby detecting movement of the switch in either direction.

In a further aspect, the invention comprises a toggle, wherein the arm comprises an elongate member, pivotally mounted at or about the middle thereof. A first elongate side of the arm is in contact with the deformable material, and an opposed elongate side comprises the user depressable surface of the switch. In this version, depression of one side or the other of the arm deforms a corresponding side of the deformable material. In turn, a light emitter/detector pair is associated with each corresponding side of the deformable material. In a further aspect, the elongate arm is pivotally mounted at one end thereof, and the deformable material engages a first elongate side of the arm, the opposed second elongate side comprises the user contact region. In this version, depression of the arm at any position thereon deforms the deformable material, thereby providing a signal to the detector. In this version, only a single light emitter/detector pair is required.

In a further aspect, the invention comprises a rotary switch, having a pivotally mounted rotatable member. The rotatable member has paired opposing contact surfaces, which may be conveniently be provided by means of an arm extending a outwardly from the rotatable member having opposed surfaces. One or more pads of the deformable material are in contact with the respective surfaces, whereby rotation of the rotatable member in a selected direction deforms a corresponding. Deformation of the deformable material is detected by a corresponding array of light emitter/detector pairs. Conveniently, the deformable material comprises two opposed pads on either side of the arm, whereby rotation of the knob in a first direction compresses a first of the pads, and rotation in the second direction compresses the second of the pads.

In a further aspect, the invention comprises a lever arm position detector, such as a joystick or a slider type switch, wherein there is further provided a mechanical motion constraint to limit movement of the arm during or following actuation by the user. In one version, the arm is arranged for linear slidable movement, and may be mounted within a housing. The arm comprises in this version a user grippable member, having an extension therefrom for contacting a pressure-sensitive pad. A deformable pad is mounted for contact with the extension, whereby movement of the arm relative to the pad deforms a portion of the pad at the contact point. The pad is underlain by an array of light emitter/detector pairs, whereby the position of the arm relative to the pad is detected by a relative increase in light intensity within the pad, where the arm contacts the pad. The arm may be arranged for unidirectional or multidirectional movement relative to the pad. Conveniently, a frictional contact member contacts the arm for restricting movement of the arm relative to the housing. The arm may comprise a base portion, a part of which is slidably retained within the housing for frictional engagement with the housing. A user grippable portion may extend upwardly from the base. In a related aspect the arm may be mounted for rotary movement within the housing, with a broadened base region. A protrusion extends from the base from a position displaced from the user grippable portion, whereby rotation of the user grippable portion rotatably displaces the protrusion relative to the pad and depresses a corresponding region of the pad, thereby signaling the relative radial position of the arm.

In a further related aspect, the invention comprises a joystick wherein the pad is arcuate or semispherical, and in contact with a portion of the arm. The arm in turn is pivotally mounted, and includes a user grippable portion on one side of the pivot mount and a contact region on the opposed side thereof. An array of light emitter/detector pairs is associated with the deformable pad, whereby rotational movement of the arm is translated through the pivot to a corresponding movement of the opposed ends. The emitter/detector pairs are arranged to detect the position of the arm as the same bears on a region of the pad. Mechanical motion constraint of the arm is provided by frictional engagement of the arm against the pad, thereby providing an appropriate user "feel" to the arm.

In a further aspect, the invention comprises a push button switch, wherein the arm is mounted for linear movement relative to the deformable pad. The arm contacts the pad at a single position on the pad, whereby linear movement of the arm deforms the single pad position. A single source/detector pair detects deformation of the pad at the point of contact with the arm.

In a further aspect, the invention comprises a pushbutton type switch characterized by a flexible enclosure, of plastic or other flexible material, which encloses a deformable pad. An upper surface of the enclosure may be depressed by the user, to deform the pad contained within the enclosure. Conveniently, the upper surface bulges outwardly, and features snap action for retaining at least temporarily the depressed configuration. A light emitter/detector pair is associated with the enclosed foam pad.

In an alternate arrangement, a push button switch comprises a plunger housed within a housing, which conveniently includes a portion contacting the plunger to impose a frictional or other mechanical restraint against movement by the plunger. A deformable foam pad and associated emitter/detector pair is housed within the base of the housing, in contact with the base of the plunger, whereby depression of the plunger depressed the pad.

In a further aspect a multifunction switch panel is provided, comprising a deformable pad, associated with multi switch means of any combination of the switch means described above. Multiple light emitter/detector pairs are associated with the pad in the region of the various switch means. A single housing conveniently retains the pad and the switch means.

In a further aspect the invention comprises, an automotive or vehicle pedal, such as a brake pedal, lined on the user contact surface with a deformable pad associated with one or more emitter/detector pairs, whereby compression of the pad by pressure of the user's feet against the pedal, compresses the pad and transmits a corresponding proportional signal to the control unit. Alternatively, the deformable pad may be positioned elsewhere, in contact with the pedal arrangement, whereby depression of the pedal, deforms and compresses the pad.

In a further aspect, the invention comprises a closure sensor for an automotive or vehicle window, comprising a deformable pad mounted within a window frame in a position for contacting a portion of the window, when the window is in the fully closed position, whereby closure of the window deforms the pad and transmits a corresponding signal to the central processing unit. In a further aspect, the invention comprises a method for detecting window closure, comprising the steps of providing a deformable pad as characterized above, mounted within the window frame of a vehicle and associated with a light emitter/detector pair and a processor unit; closing the window sufficiently to contact and compress the pad; transmitting a corresponding signal to the processor unit; stopping a window closure motor in response to a signal from the processor unit.

These and other aspects of the invention will now be described by way of a detailed description of the preferred embodiments and by reference to the accompanying drawings.

BRIEF DESCRIPTION OF THE DRAWINGS

FIG. 8, is a schematic view, illustrating a vehicle pedal embodiment of the invention;

FIG. 9, is a schematic view, illustrating window closure sensor according to the present invention;

DETAILED DESCRIPTION OF THE PREFERRED EMBODIMENTS

Figure 1:
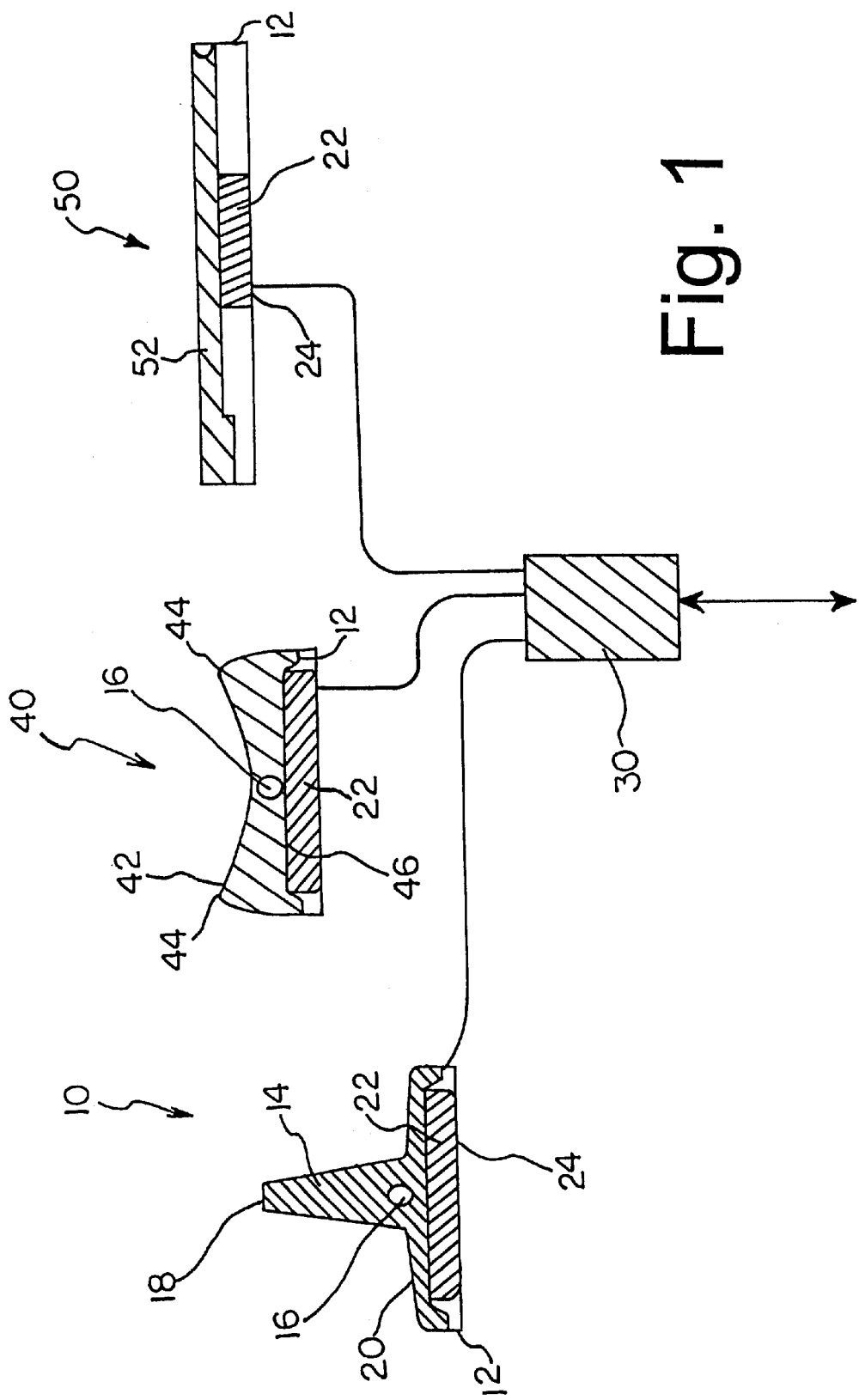
FIG. 1 is a schematic, sectional view of the present invention, illustrating first, second and third embodiments of switches according to the present invention.

Turning to FIG. 1, various one/off switches are disclosed. A rocker switch 10 comprises a housing 12, a lever arm 14 mounted by way of pivot mount 16 within the housing 12. The lever arm comprises an outwardly-extending user grippable portion 18, and a broad plate like base portion 20. Pivotal movement of the lever arm about the pivot is thereby converted to a rocking motion of the base within the housing. Frictional movement of the base against the housing provides a mechanical motion constraint, in order to provide a proper user "feel" to the switch. A deformable pad 22 is housed within the housing. The pad 22 comprises a light translucent foam material, which is compressible and deformable. The pad is position between the floor of the housing and the lever arm base, and extends substantially along the base portion and in contact therewith. Pivoting of the base portion 20 by actuation of the arm 14 thereby compresses either one end or the other of the pad 22. Light is transmitted into the pad and detected, by means of an array of light emitter/detector pairs 24. The emitters and detectors may comprise fiber optic cables, linked to a central control unit. Alternatively the light source may comprise an LED or other light source emitting directly into the pad. Similarly, the detector may comprise a photo detector within the housing and against the pad. Emitter/detector pairs 24 are provided at either end of the pad, whereby compression at either end is separately detected.

The emitter/detector pairs are linked electronically or optically to the central control unit 30. The control unit 30 in turn receives light intensity information from each detector 24, and converts this information into an electronic signal indicating the relative position of the lever arm. This information is then transmitted electronically by means of a cable means, to downstreams not shown. A power source, not shown, provides electrical power to the arrangement.

In a further arrangement comprising a toggle-type switch 40, the lever arm 42 is generally longitudinal, and is mounted at a central region thereof, pivotally within the housing. A user depressable portion 44 at either end of the switch, and on either side of the pivot mount 16, compresses one side or other of the arm. A flat base 46 on the side of the arm opposed to the user contact regions, engages a deformable pad 22, which is otherwise essentially of the type described above.

In a further version comprising a key switch 50, the switch lever arm 52 is pivotally mounted at one end thereof, and a user depressable region effectively compresses the pad 22, which is in turn positioned between the lateral side of the switch and the housing. Within this arrangement, it is required to have only a single emitter/detector pair 24, since the entirety of the pad is effectively compressed by depression of the arm.

Within the arrangement described above, mechanical motion constraint of the arm is provided by a frictional contact between a portion of the arm and the housing 12 and the housing.

Figure 2:
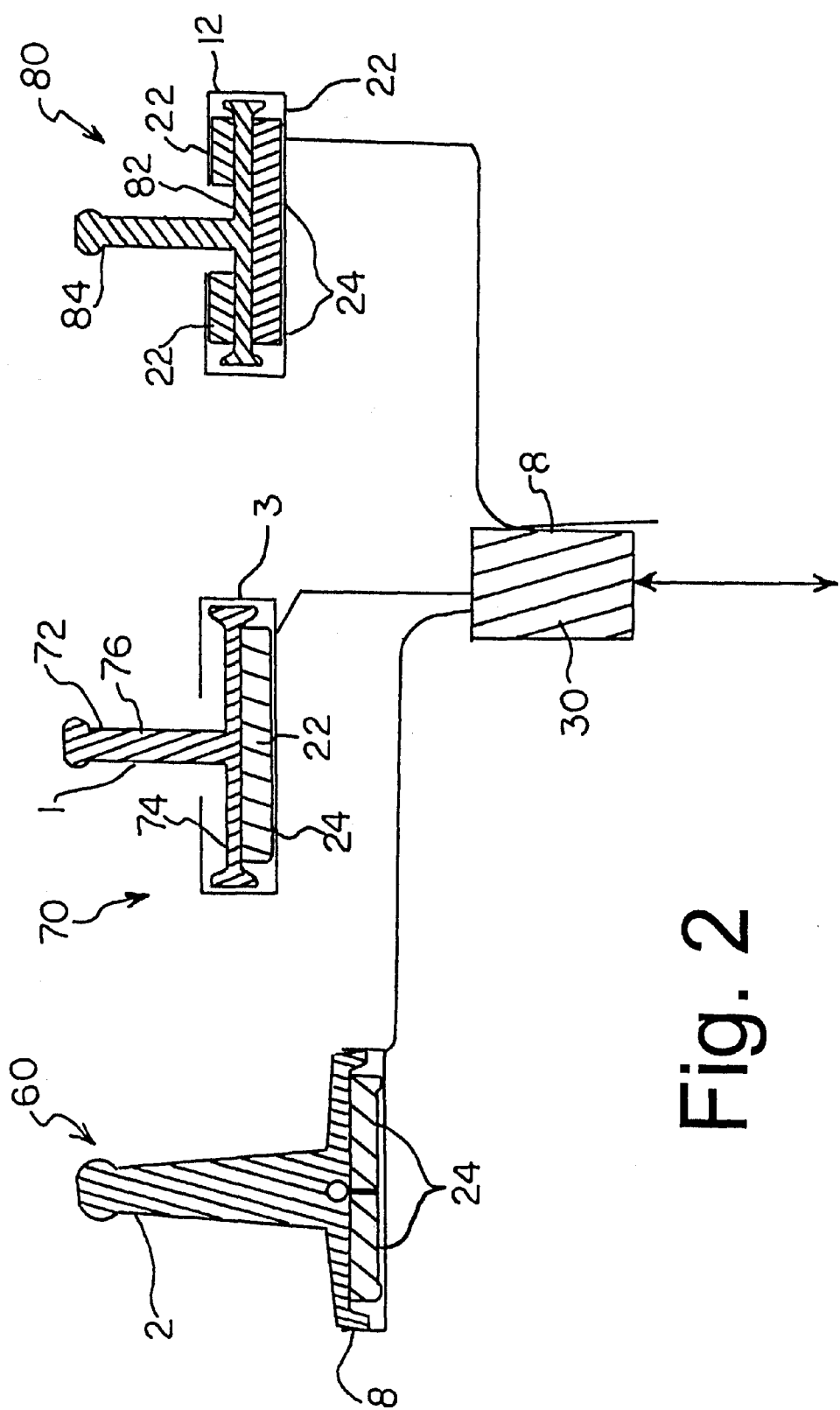
FIG. 2 is a sectional view schematic, illustrating three additional embodiments of the present invention, comprising joystick arrangements.

FIG. 2 illustrates the various joystick type sensors. In a first arrangement, the joystick 60 is similar in principle to the rocker type switch, and permits 2 degrees of movement of the stick along a linear path. The sensor arrangement provides an enhanced sensitivity, wherein the relative position of the lever is detected on a generally continuous basis, rather than simple detection of on/off positions.

To provide a multidirectional joystick 70, pivotal movement of the arm 72 in two axis is detected. Third, in this arrangement, the arm comprises a generally plate like base portion 74, and a user grippable member 76 extending outwardly therefrom. The base portion 74 rests on a deformable pad 22, within the housing. An array of emitter/detector pairs 24 is in communication with the pad, whereby deformation of the pad in response to compression of any portion thereof, transmits a corresponding signal to the processing unit 30. Within this arrangement, the arm 72 may be moved within a pivotal movement in any direction within a plane, and the same is detected by the detector array.

A further arrangement is similar to the above and comprises a multidirectional joystick 80 which provides additional deformable pads 22 and corresponding emitter/detectors pairs 24. The pads 22 are positioned to rest against the lever arm base 82 on the side opposed to the first pad, and between the base and the housing 12. Within this arrangement, an additional degree of movement is detected, namely, linear displacement of the arm 84 in a direction transverse to the base.

Figure 3:
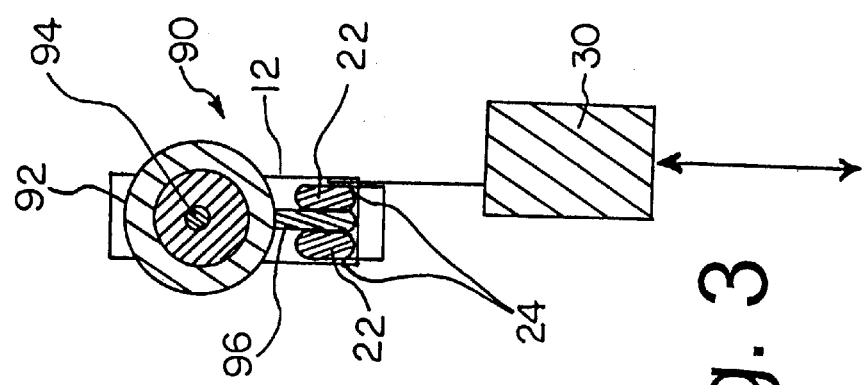
FIG. 3, is a schematic view of the present invention, illustrating a rotary switch.

A further embodiment is illustrated in FIG. 3. This comprises a rotary switch 90, comprising a rotatable knob 92, pivotally mounted to a housing 12 for rotary movement about a pivot 94. A plate like extension 96 extends outwardly from the knob 92 and is positioned within the housing. Two deformable pads 22 are positioned on other side of the extension, and are retained between the extension and a corresponding wall of the housing. Rotary movement of the knob achieves a corresponding compression of one or the other pads. Emitter/detector pairs 24 within each of the pads thus transmit a corresponding signal to the central processing unit 30, indicating rotation of the knob in one direction or the other.

Figure 4:
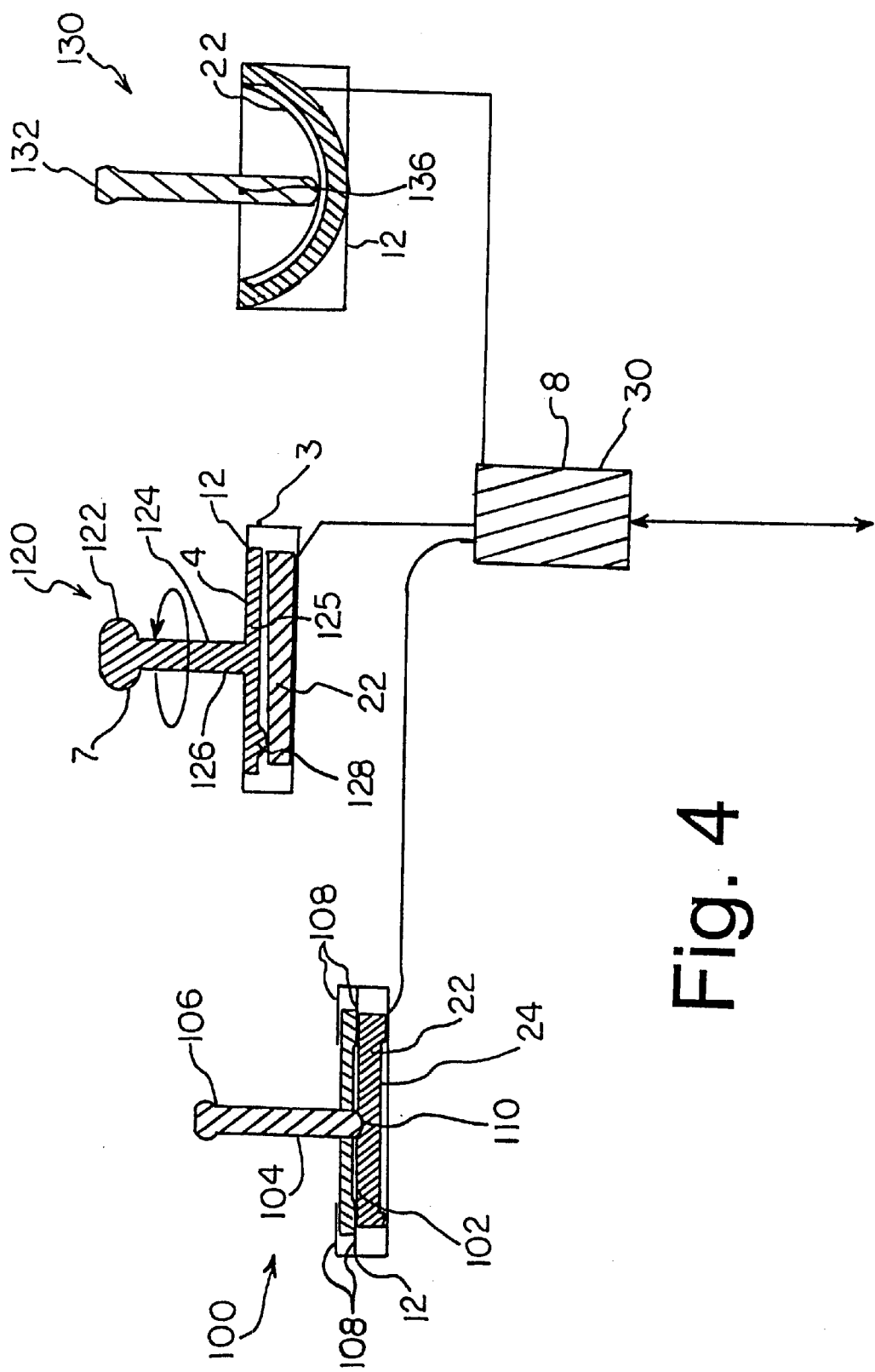
FIG. 4, is further schematic view of the present invention, illustrating slider, rotary and joystick type switches.

FIG. 4 illustrates further switch and joystick arrangements. A slider type control 100 comprises a housing 12 for enclosing the base portion 102 of a lever arm 104. A user grippable portion 106 extends outwardly from the housing 12. The plate like base 102 is frictionally engaged within the housing, conveniently by including paired spaced apart flanges 108 between which the base is slidably retained with sufficient frictional engagement to provide a suitable user "feel" to the switch. The base of the arm is substantially flat, but features a protrusion 110 extending outwardly from the base, opposed to the user grippable portion. A deformable pad 22 is housed within the enclosure and in contact with the arm base and protrusion. The protrusion thus deforms a region of the pad where the same contacts the pad. Slidable movement of the lever arm 104 with the housing thus deforms a corresponding region of the pad 22. An array of emitter/detector pairs 24 in contact with the pad, detect the region of the pad which is compressed by the extension, and communicates this information to the power and communications connection and the central control unit 30.

A similar arrangement may be provided to achieve a rotary control 120, wherein the user grippable portion 122 of the arm 124 may be rotated relative to the housing. For this purpose, the housing substantially encloses the arm base 125, and includes a central aperture 126 through which the user grippable portion extends. Slidable movement is thus substantially prevented, with the only permissible movement thus being rotary. A protrusion 128 extends from the arm base 125 at a position displaced from the user grippable portion, whereby rotation of the arm 124 results in a corresponding arcuate movement of the protrusion 128, with the same being detected by the pad 22.

Within a further joystick arrangement 130, the pad 22 is mounted within the housing in a generally arcuate or semi-spherical arrangement. The lever arm 132 is pivotally mounted within the housing, with a user grippable portion 134 extending outwardly from the housing. Pivotal movement of the arm, either in a linear path or a multidirectional path which follows two axes of movement, causes an opposed region 136 of the arm within the housing to contact a corresponding portion of the deformable pad. An array of emitter/detector pairs 24 associated with the pad, communicates the corresponding joystick position, to the central control unit 30.

Figure 5:
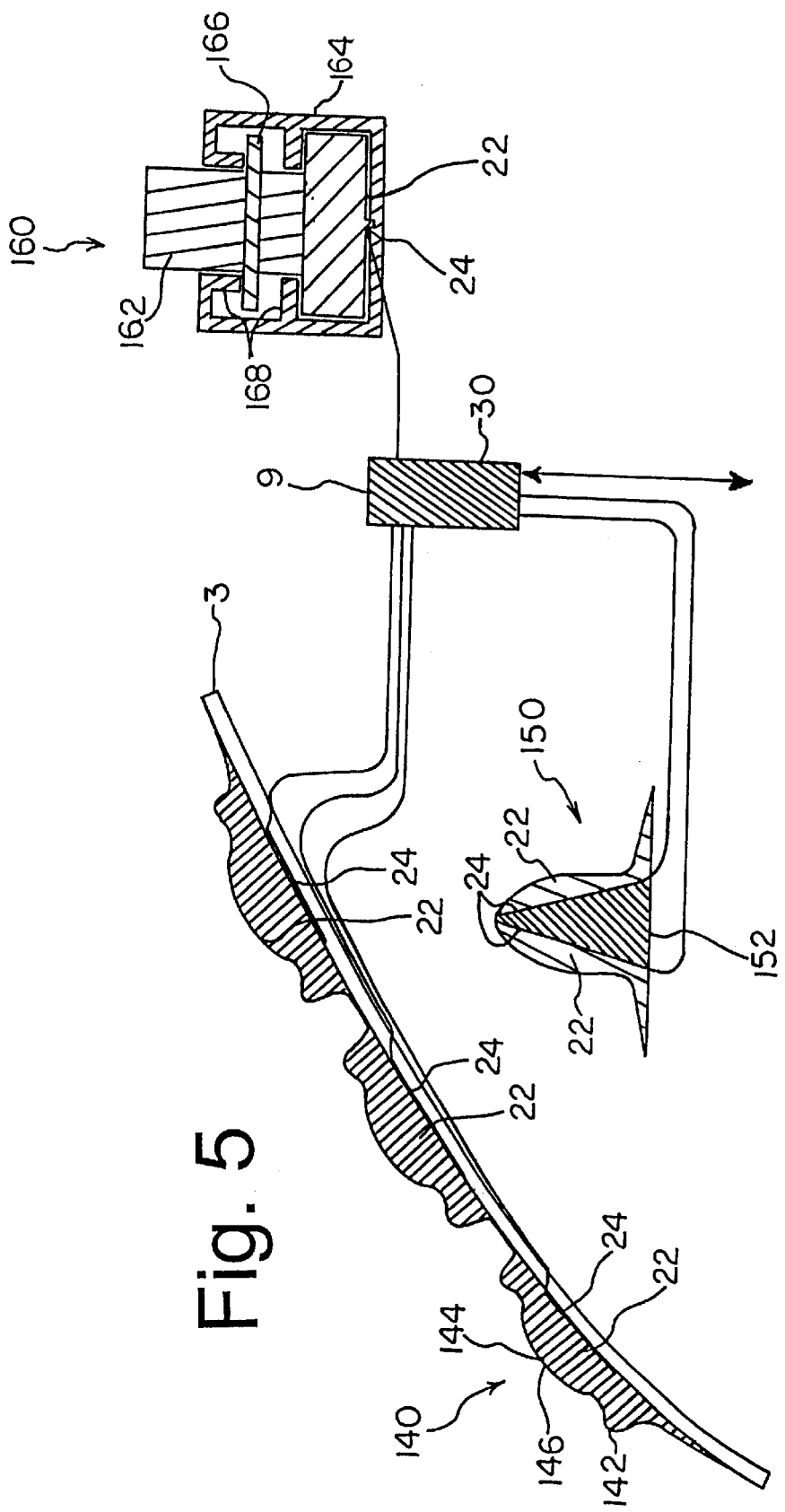
FIG. 5, is a schematic view, illustrating a push button embodiments of the present invention.

FIG. 5 illustrates various push button type switches. In a first arrangement, a dimple switch 140 comprises an enclosure 142 having an upper surface 144 which is flexible. Conveniently, the enclosure may be fabricated from a flexible plastic or alternatively, spring steel. The upper surface conveniently bulges outwardly, and may have a dimple 146 at the top of the bulge, for user ergonomics. The enclosure is essentially filled with a deformable pad 22. Depression of the upper surface of the enclosure, correspondingly compresses the pad. A light emitter/detector pair 24 within the enclosure 142 and associated with the pad conveys the corresponding information to the central control unit 30. Conveniently, the enclosure is shaped to provide a snap action, whereby the depressed position is maintained, at least for a limited period of time, before snapping outwardly.

A further arrangement, a two-way switch 150 comprises a rigid base 152, which is conveniently conical or wedged shaped, having on two opposed sides thereof a pair of deformable foam pads 22. A light emitter/detector pair is associated with each foam pad, and is conveniently mounted between the pad and the base. Depression by the user of one or the other foam pad, actuates the corresponding signal, which in turn is relayed to the central control unit 30.

A further push button type switch 160 comprises a housing, with a plunger type arm 162 mounted slidably with the housing 164. Conveniently, a portion of the housing is in frictional engagement with the arm, to provide a mechanical constraint and proper user "feel". Movement of the plunger is restricted by means of a flange 166 extending outwardly from the plunger, which in turn is retained between stop members 168 within the housing, to limit vertical travel of the plunger. The base of the plunger is in contact with a deformable foam pad 22, which is housed within the base of the housing. A light emitter/detector pair 24 is in communication with the pad, whereby depression of the plunger results in a consequent compression of the pad, thereby transmitting a signal to the central control unit 30.

Figure 7:
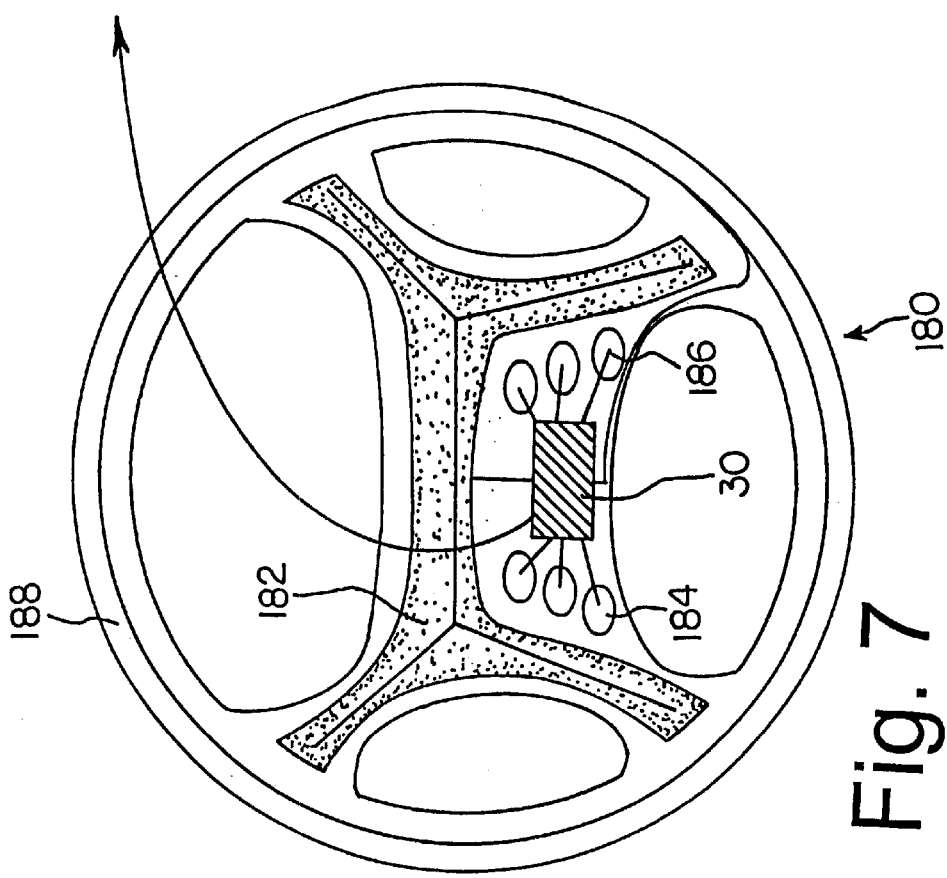
FIG. 7 illustrates a vehicle steering wheel embodying an aspect of the invention.
Figure 6:
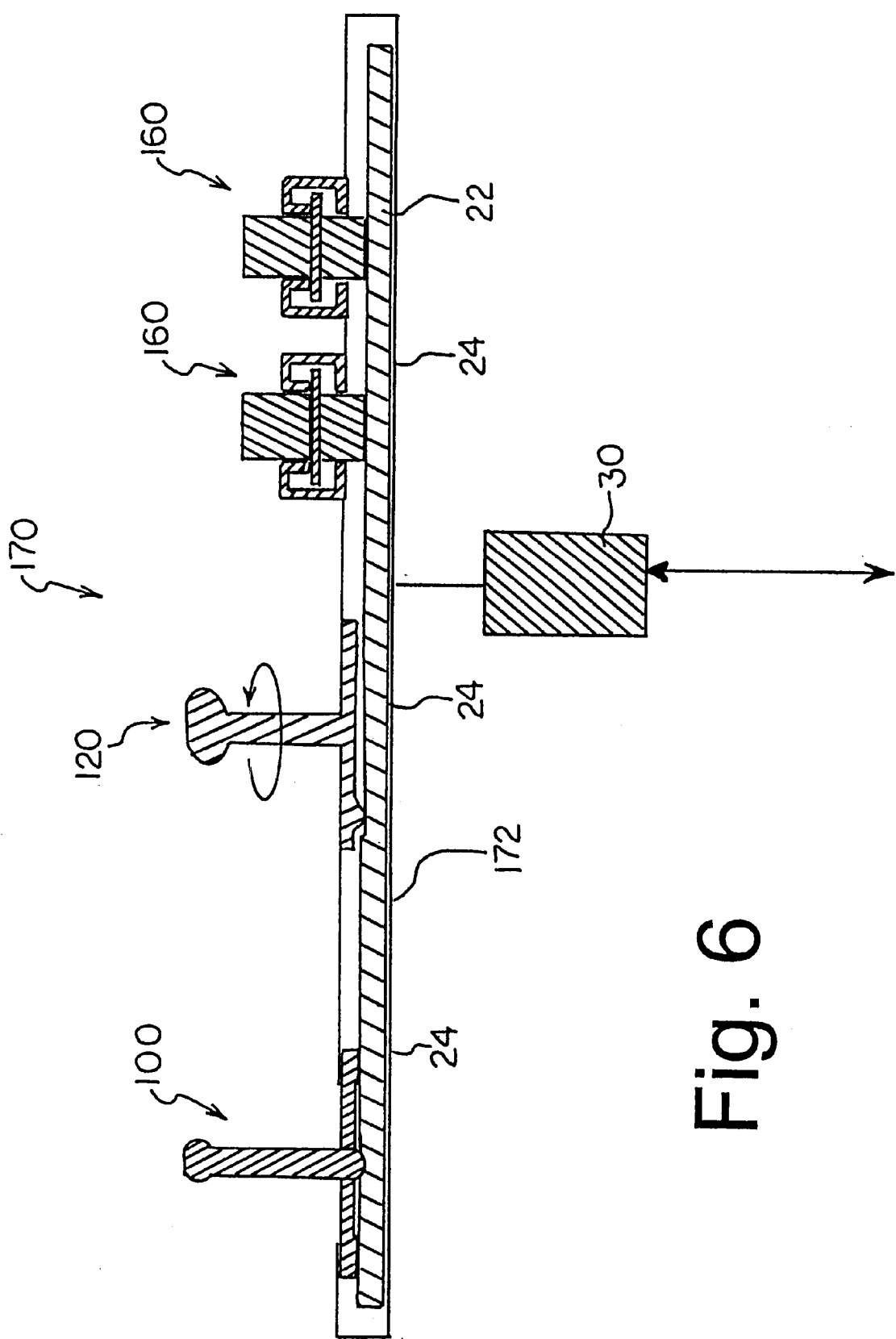
FIG. 6, is a schematic view, illustrating a multifunction panel embodiment of the invention.

FIG. 6 illustrates a multifunction panel 170, comprising an elongate housing 172, which houses an elongate deformable pad 22. An array of emitter/detector pairs 24 is associated with the pad and a central control unit. An array of switches, joysticks and the like as described above are mounted within the housing, in contact with selected regions of the pad 22. According to this arrangement, a single control unit 30 and detector pad and housing thus provide multi switch functions. The same may be useful within, for example, an automobile steering wheel 180 (as seen in FIG. 7), thereby permitting multiple functions to be provided within the single switching systems. For example, the automotive horn 182, radio controls 184, and other vehicle controls 186 may be provided within a single panel within the vehicle steering wheel hub. A wheel grip detector 188 circumferentially surrounding the wheel comprises a deformable pad 22 linked to a processor 30 within the wheel hub. A similar arrangement may be provided in, for example a vehicle dash board or door panel, for similar purposes.

FIG. 8 illustrates a vehicle pedal such as a brake pedal 200, which features a user foot position detector. The brake pedal comprises a generally conventional pivotally mounted pedal 201. A user foot contact surface 204 is lined with the deformable pad 22. Conveniently, a rubber or other durable surface 206 is laminated or fixed to the pad to prevent excess wear. An array of emitter/detector pairs 24 is mounted between the pad and the pedal base, whereby pressure against the pad conveys a corresponding signal to the central processor unit 30. The processor is arranged to detect the level of pressure against the pad, and the corresponding information is relayed to a breaking system or other downstream recipients not shown. In order to provide the user a conventional brake pedal feel, the pedal is also pivotally mounted and spring biased to urge the pedal rearwardly. In an alternative or supplemental arrangement, the biasing of the pad is provided by means of a further deformable pad 210 associated with an emitter/detector pair 24, and mounted between the pedal and a portion of the vehicle frame or floor, adjacent to and displaced from the pivot mount 212. The deformable pad 210 thus both provides the spring biased means for urging the pedal against the users foot, and further transmits a signal indicating the effective position of the pedal relative to the vehicle floor. Alternatively, the pedal liner may be dispensed with and the second pad 210 may solely be relied on.

FIG. 9 illustrates a vehicle window closure sensor to 20. The sensor comprises a deformable pad 222, which is mounted within the window frame 224 of a vehicle, at an upper region thereof, where the window contacts the frame when in the closed position. An emitter/detector pair is associated with the pad, and detects optically compression of the pad. A central processing unit 30 receives information from the emitter/detector pairs, and detects closure of the window upon compression of the pad 222. A similar door closure detector 230 comprises a compressible pad 232 mounted within the door frame at a suitable position for detection of closure of vehicle door. The pad 232 is in turn linked to a central processor 30. It will be seen that the pads 222 and 232 may serve the dual functions comprising a water and airtight gasket surrounding the door and window, respectively and a pressure sensor as characterized above.

It will be seen that although the present invention has been described by way of preferred embodiments thereof, departures from and variations to these embodiments may be made while remaining within the spirit and scope of the invention as defined within the appended claims.

We claim:

1. A control device for human control of electrical equipment: comprising:
   a user interface for manipulation by a user, comprising a rigid member having a first contact region for actuation by a user, and a second contact region spaced from said first contact region;
   a support for supporting said user interface, said interface being mounted to said support for relative movement between said interface and support;
   a first volume of compressible and resilient material supported by said support in contact with said second contact region of said user interface, sad material being light translucent and having light scattering centers generally evenly disbursed throughout said volume to fully scatter a beam of light within said compressible material;
   a light source in operative communication with said material for transmitting a beam of light into said material and forming within said material an integrated cavity comprising a region of fully scattered light wherein compression of said integrated cavity results in an increase in light intensity within said cavity;
   at least one light detector means in operative communication with said compressible material for detecting the intensity of fully scattered light within said cavity and changes in intensity of said light in response to compression of said material by said user interface;
   signal processor means in communication with said light source means and said detector means, for receiving information indicative of the light level detected by said detector means, and converting said information into information indicative of the position of said interface relative to said support, for control of said electrical equipment; and
   said user interface, support and compressible and resilient material being arranged and adapted for compression of a region of said material by said user interface, wherein manipulation and displacement of said interface by a user, relative to said support, changes the location of said compressed region relative to said support for communicating to said electrical equipment the position of said interface relative to said support.

2. A control device as defined in claim 1, wherein said user interface is mounted to said support for movement about a single axis of rotation.

3. A control device as defined in claim 1, wherein said user interface is mounted to said support for movement about two axes of rotation.

4. A control device as defined in claim 1, wherein said user interface is mounted to said support for movement about three axes of rotation.

5. A control device as defined in claim 1, wherein said user interface is mounted to said support for linear sliding movement.

6. A control device as defined in claim 5, wherein said user interface is provided with only one of said second contact regions, in communication with a single volume of compressible material.

7. A control device as defined in claim 1, wherein:
   said user interface comprises an arm having an elongate axis and a base, said base comprising said second contact region;
   said base having a means for compressing a region of said material, radially displaced from said elongate axis; and
   said light source and detector comprising a plurality of light sources and detectors spaced about said material.

8. A control device as defined in claim 1 comprising a joystick, wherein:
   said user interface comprises an arm having an elongate axis, said arm having a base comprising said second contact region;

said light source and detector means comprising a plurality of light sources and detectors spaced for communication with substantially all of said body of said material.

9. A device as defined in claim 8, wherein said arm is mounted to said support for pivoting about a single axis rotation.

10. A device as defined in claim 9, wherein said axis is coaxial with said elongate axis of said arm, and said base includes means for compressing a region of said material radially displaced from said axis.

11. A device as defined in claim 9, wherein said axis is transverse to said elongate axis of said arm for permitting a rocking movement of said arm.

12. A device as defined in claim 8, wherein said arm is mounted to said support for pivoting about two, axes of rotation.

13. A device as defined in claim 8, wherein said arm is mounted to said support for pivoting about three axes of rotation.

14. A device as defined in claim 8, wherein said support comprises a part-spherical concavity, said compressible material forming a lining of said concavity.

15. A device as defined in claim 8, wherein said compressible material comprises a cellular foam plastic material.

16. A device as defined in claim 8, wherein said second contact region comprises a broadened base of said arm, the underside of said base has a means for compressing a region of said material radially displaced from the elongate axis of said arm.

17. A device as defined in claim 8, wherein said base extends; laterally outwardly from said arm for compressing a region of said material radially displaced from said arm.

18. A device as defined in claim 17 wherein said support comprises a housing at least partly enclosing said material for retaining said base with the interior of said housing.

19. A device as defined in claim 18 further comprising a second volume of said compressible material opposed to said first volume of compressible material and positioned between an upper face of said base and the interior of said housing.

20. A control device as defined in claim 1 comprising an on/off or proportional control switch wherein said compressible material comprises at least two regions each associated with a light source and a detector means, said user interface comprising a lever arm having two sides, each side being in contact with a separate of said regions of compressible material for compressing one or the other of said regions in response to movement of said interface.

21. A device as defined in claim 20 wherein said interface comprises a generally platelike base having an arm extending upwardly therefrom, said material comprising a pad for supporting said base.

22. A device as defined in claim 21, wherein said support comprises a housing at least partly surrounding said base; said compressible material being positioned both above and below said base wherein pivotal movement of said user interface results both in compression of a first portion of said material between an upper surface of said base and said housing and compression of a second portion of said material diagonally opposed to said first portion.

23. A device as defined in claim 21, wherein said support comprises a housing confining said base to retain said arm to said support and limiting the pivotal movement of said arm.

24. A device as defined in claim 21, wherein said first contact region of said user interface comprises a rotatable knob, said knob being mounted to said support for rotation about the axis of said knob; said second contact region comprising a paddle extending radially outwardly from said knob whereby, rotation of said knob translates into arcuate movement of said paddle, said compressible material being provided in two portions on either side of said paddle and confined within said support, whereby arcuate movement of said paddle compresses one portion or the other of said compressible material, said light source means and detector means being in communication with both sides of said compressible material.

25. A device as defined in claim 1 wherein said user interface comprises a plunger, the base of which comprises said second region, said support comprising a housing for partly confining said plunger.

* * * * *